United States Patent
Brinkman et al.

(10) Patent No.: US 10,814,264 B2
(45) Date of Patent: Oct. 27, 2020

(54) SIOX FILTRATION UNIT AND METHOD FOR OPERATING THE SIOX FILTRATION UNIT

(71) Applicant: TOTAL MARKETING SERVICES, Puteaux (FR)

(72) Inventors: William Brinkman, Sherman, TX (US); Sebastien Rifflart, Emeryville (CA)

(73) Assignee: TOTAL MARKETING SERVICES, Puteaux (FR)

( * ) Notice: Subject to any disclaimer, the term of this patent is extended or adjusted under 35 U.S.C. 154(b) by 273 days.

(21) Appl. No.: 15/766,415

(22) PCT Filed: Oct. 10, 2016

(86) PCT No.: PCT/EP2016/074234
§ 371 (c)(1),
(2) Date: Apr. 6, 2018

(87) PCT Pub. No.: WO2017/060529
PCT Pub. Date: Apr. 13, 2017

(65) Prior Publication Data
US 2018/0290093 A1    Oct. 11, 2018

(30) Foreign Application Priority Data
Oct. 9, 2015   (EP) .................................... 15306599

(51) Int. Cl.
*B01D 46/24*    (2006.01)
*B01D 46/00*    (2006.01)
*C30B 15/00*    (2006.01)

(52) U.S. Cl.
CPC ........ *B01D 46/2411* (2013.01); *B01D 46/002* (2013.01); *B01D 46/0005* (2013.01);
(Continued)

(58) Field of Classification Search
CPC .................. B01D 46/002; B01D 46/0058; B01D 46/008; B01D 46/4272; B01D 46/2411;
(Continued)

(56) References Cited

U.S. PATENT DOCUMENTS 6,287,528 B1    9/2001   Weber
2003/0200867 A1  10/2003  Becker et al.
(Continued)

FOREIGN PATENT DOCUMENTS

CN    102985732 A    3/2013
DE    195 16 925 A1   11/1996
(Continued)

OTHER PUBLICATIONS

International Search Report dated Dec. 9, 2016 in PCT/EP2016/074234 filed Oct. 10, 2016.
(Continued)

*Primary Examiner* — Robert Clemente
(74) *Attorney, Agent, or Firm* — Oblon, McClelland, Maier & Neustadt, L.L.P.

(57) ABSTRACT

There is provided a Czochralski puller installation for Si monocrystalline ingot growth, including: a Czochralski puller; a SiOx dust filter system; and a vacuum pump connected downstream of said SiOx dust filter system, the SiOx dust filter system including at least a first filtration branch having a first SiOx filter unit, and at least a second filtration branch having a second SiOx filter unit, the first filtration branch and the second filtration branch being disposed in parallel and connected to a common first connection point upstream of first and second upstream valves and to a common second connection point downstream of first and second downstream valves, the first and the second filtration branches being connected through a bypass branch
(Continued)

Figure 1:
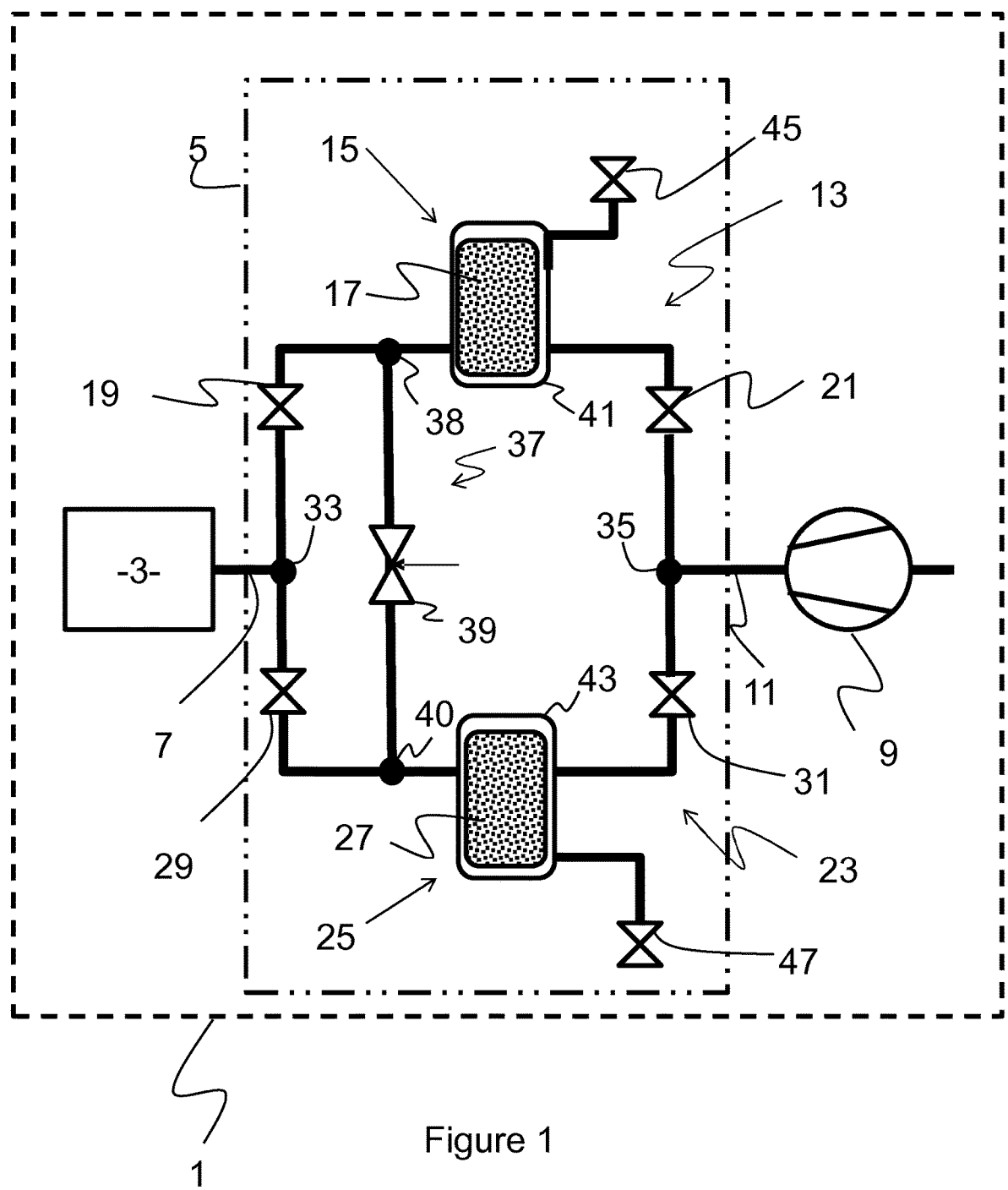

having a needle valve for pressure equilibration between the first and the second filtration branches.

5 Claims, 2 Drawing Sheets

(52) U.S. Cl.
CPC .......... *B01D 46/0058* (2013.01); *C30B 15/00* (2013.01); *B01D 2257/55* (2013.01); *B01D 2258/02* (2013.01); *B01D 2273/28* (2013.01); *B01D 2277/10* (2013.01)

(58) Field of Classification Search
CPC ............ B01D 2273/28; B01D 2277/10; B01D 46/0005
See application file for complete search history.

(56) References Cited

U.S. PATENT DOCUMENTS

| | | |
|---|---|---|
| 2013/0068979 A1 | 3/2013 | Schlichter et al. |
| 2014/0338293 A1 | 11/2014 | Williams et al. |

FOREIGN PATENT DOCUMENTS

| | | |
|---|---|---|
| DE | 198 54 235 A1 | 5/2000 |
| DE | 10 2005 022 101 A1 | 5/2006 |
| DE | 10 2010 025 153 A1 | 12/2011 |

OTHER PUBLICATIONS

Combined Chinese Office Action and Search Report dated Feb. 3, 2020 in Chinese Patent Application No. 201680058898.5 (with English translation), 17 pages.

SIOX FILTRATION UNIT AND METHOD FOR OPERATING THE SIOX FILTRATION UNIT

FIELD OF THE INVENTION

The invention relates to a SiOx filtration unit and a method for operating such a filtration unit.

BACKGROUND AND PRIOR ART

Exhaust gases out of Czochralski pullers used for monocrystalline ingot growth contain fine dust particles, in particular of Si, that are formed by condensation above the silicon melt.

Such fine silicon dust is very reactive and oxidizes quite very quickly to SiO and $SiO_2$ which can be very hazardous and dangerous not only for the operators of the Czochralski pullers, but also to the equipment connected downstream like vacuum pumps.

Thus, this dust needs to be filtered out.

Conventionally, this is done by using disposable filters that need to be changed periodically for removing efficiently the SiOx dust. However, once the filter begins to clog, the upfront pressure begins to rise, even above the authorized control conditions for monocrystalline ingot growth. As a consequence, in case the crystal growth occurs outside the standard limits, the ingot has to be treated as possible discrepant material.

DE19516925 discloses an industrial dust separation process, in particular for continuous separation of $SiO_2$ dust from a carrier gas stream. This dust separation process involves passing the gas stream charged with dust through a filter medium of a dry filtering system for dust removal.

The dry filtering system comprises an identical, parallel and redundant arrangement of two gas pipelines, each of which has a cartridge filter followed by a suspension filter, the two pipelines combining, downstream of the suspension filters, as a common waste gas line leading via a gas scrubber to a suction fan.

Once a filter gets clogged, the gas stream is conducted through the other filter and the clogged filter cleaned regenerate through injection of a neutral cleaning gas like nitrogen.

However, while isolating or reinserting the filter into the circuit, pressure variations occur. DE19516925 discloses a complex and expensive regulation system to prevent pressure variations including a pressure sensor, a fan control circuit and a system processor.

Document DE102010025153 discloses a switching device for a fluid flow having a first fluid-carrying connection and a second fluid-carrying connection between a first and a second treatment device, wherein the first and second fluid-carrying connections are connected by a needle valve.

However document DE102010025153 relates to high pressure gases and is not suitable for exhaust gases of Czochralski pullers.

Document US2014/0338293 discloses a duplex fluid filter assembly with bypass branches and complex controlled solenoid valves.

The present invention proposes a Czochralski puller installation comprising a SiOx dust filter unit that is in particular easier to handle, less expensive and more robust.

To this extent, the present invention proposes a Czochralski puller installation for Si monocrystalline ingot growth comprising a Czochralski puller, a SiOx dust filter system, and a vacuum pump connected downstream to said SiOx dust filter system, the SiOx dust filter system comprising at least a first filtration branch having a first SiOx filter unit presenting an exchangeable filter contained in a canister comprising a canister valve allowing to increase pressure in the canister to atmospheric pressure during filter change, a first upstream valve and a first downstream valve for isolating the first SiOx filter unit during filter change, at least a second filtration branch having a second SiOx filter unit presenting an exchangeable filter contained in a canister comprising a canister valve allowing to increase pressure in the canister to atmospheric pressure during filter change, a second upstream valve and a second downstream valve for isolating the second SiOx filter unit during filter change, the first filtration branch and the second filtration branch being disposed in parallel and connected to a common first connection point upstream the first and the second upstream valves and to a common second connection point downstream the first and the second downstream valves, wherein the first and the second filtration branch are connected through a bypass branch having a needle valve for pressure equilibration between said first and the second filtration branch.

The Czochralski puller installation according to the invention may comprise one or several of the following features taken alone or in combination:

According to one aspect, the first filter unit and the second filter unit comprise respectively and as filter a SiOx filter cartridge. According to another aspect the needle valve is configured to be controlled between a closed position inhibiting a gas flow between the first and the second filtration branch and at least one open position allowing gas to flow between said first and second filtration branch.

According to a further aspect the common second connection point is configured to be connected to the vacuum pump, said pump having a maximum pumping flow and the needle valve is configured to let pass in said open position a gas flow enough for pressure reduction in one of said first respective second SiOx filter units while pressure variation at Czochralski puller stays in the acceptable tolerance limits of Czochralski pulling process.

According to yet a further aspect, the bypass branch is connected to a third connection point situated between the first SiOx filter unit and the first upstream valve of the first filtration branch and a fourth connection point situated between the second SiOx filter unit and the second upstream valve of the second filtration branch.

The invention also has for object the associated SiOx dust filter system for exhaust gases from a Czochralski puller, comprising:

at least a first filtration branch having a first SiOx filter unit presenting an exchangeable filter contained in a canister comprising a canister valve allowing to increase pressure in the canister to atmospheric pressure during filter change, a first upstream valve and a first downstream valve for isolating the first SiOx filter unit during filter change, at least a second filtration branch having a second SiOx filter unit presenting an exchangeable filter contained in a canister comprising a canister valve allowing to increase pressure in the canister to atmospheric pressure during filter change, a second upstream valve and a second downstream valve for isolating the second SiOx filter unit during filter change, the first filtration branch and the second filtration branch being disposed in parallel and connected to a common first connection point upstream the first and the second upstream valves and to a common second connection point downstream the first and the second downstream valves, wherein the first and the second filtration branch are connected through a bypass branch having a needle valve for pressure equilibration between said first and second filtration branch.

Finally, the invention also relates to the associated method for operating a Czochralski puller installation as described comprising the following steps:
close the needle valve and an upstream and a downstream valves of one filtration branch in order to isolate the SiOx filter unit, the upstream and a downstream valves of the other filtration branch being in an open position,
open a canister valve in order to put the canister of said SiOx filter unit at atmospheric pressure,
open the canister and exchange the filter of the isolated SiOx filter unit,
close said canister valve and said canister,
open said needle valve for pressure equilibration between both filtration branches,
open said downstream valve for maintaining equal pressure between both filtration branches,
close said needle valve.

BRIEF DESCRIPTIONS OF THE DRAWINGS

Figure 2:
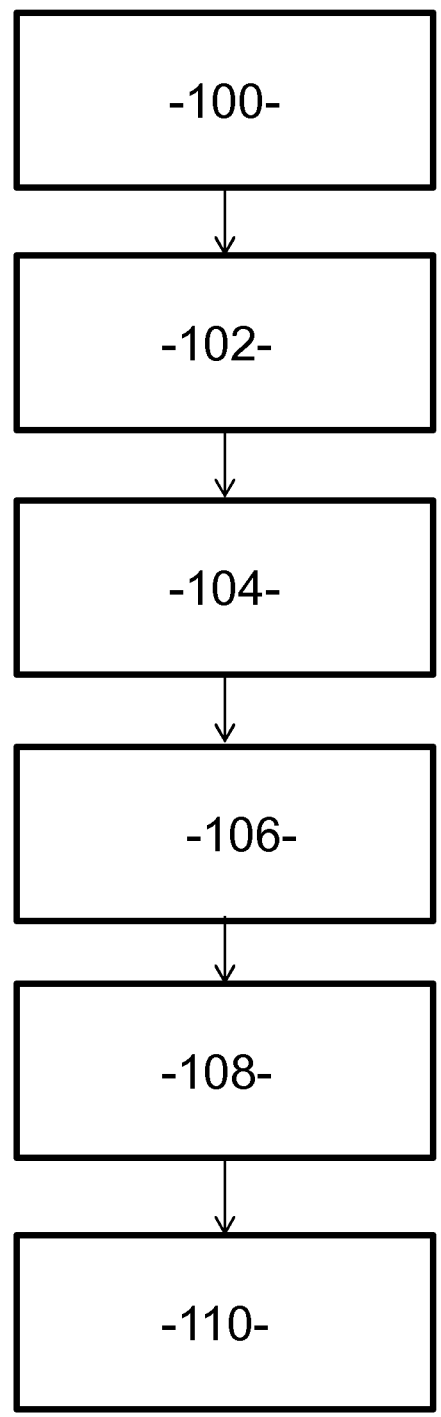

Other advantages and characteristics will appear with the reading of the description of the following figures, among which:

FIG. 1 shows a schematic representation of a Czochralski puller installation for Si monocrystalline ingot, FIG. 2 shows an example of a flow chart for illustrating the method of operation of the dust filter unit according to the invention.

DETAILED DESCRIPTION

On all the figures the same references refer to the same elements.

The embodiment(s) in the following description are only to be considered as examples. Although the description refers to one or several embodiments, this does not mean inevitably that every reference concerns the same embodiment, or that the characteristics apply only to a single embodiment. Simple characteristics of various embodiments can be also combined to new embodiments that are not explicitly described.

In the present description, the terms downstream and upstream are used with respect to the normal gas flow in the pipes.

FIG. 1 shows a schematic representation of a Czochralski puller installation 1 for Si monocrystalline ingot growth.

The Czochralski puller installation 1 comprises at least one Czochralski puller 3 and a SiOx dust filter system 5 connected downstream to the Czochralski puller 3 through and exit pipe 7.

The Czochralski puller installation 1 further comprises a vacuum pump 9 connected downstream to said SiOx dust filter system 5 through an output connection pipe 11.

In a typical mono-crystalline silicon Czochralski process, the pressure is regulated during the pulling process that lasts for several days with an Argon flow at approximately 10-40 mbar.

The SiOx dust filter system 5 according to the invention comprises on the one hand a first filtration branch 13 having a first SiOx filter unit 15 presenting an exchangeable filter 17, a first upstream valve 19 and a first downstream valve 21 for isolating the first SiOx filter unit 15 during filter change and on the other hand a second filtration branch 23 having a second SiOx filter unit 25 presenting an exchangeable filter 27, a second upstream valve 29 and a second downstream valve 31 for isolating the second SiOx filter unit 25 during filter change.

The first filtration branch 13 and the second filtration branch 23 are disposed in parallel and connected to a common first connection point 33 upstream the first 19 and the second 29 upstream valves and to a common second connection point 35 downstream the first 21 and the second 31 downstream valve.

Furthermore the first 13 and the second 23 filtration branch are connected through a bypass branch 37 having a needle valve 39 for pressure equilibration. Such pressure equilibration is operated in a smooth way between said first 13 and the second filtration branch 23 in particular after exchange of a filter when concerned the filter unit 15 or 25 is at atmospheric pressure whereas the other filter unit 25 or 15 is submitted to the pressure mono-crystalline silicon Czochralski process and when the exchanged filter is put into filtration operation.

More in detail, the bypass branch 37 is connected to a third connection point 38 situated between the first SiOx filter unit 15 and the first upstream valve 17 of the first filtration branch 13 and a fourth connection point 40 situated between the second SiOx filter unit 25 and the second upstream valve 27 of the second filtration branch 23.

According to a non-represented embodiment, one may envisage more than only two filtration branches in parallel.

It is also possible to connect the SiOx dust filter system not only to one Czochralski puller but to several pullers connected in parallel to the SiOx dust filter system.

Furthermore, the vacuum pump 9 may be realized as one or several vacuum pumps connected in parallel and/or in series.

The first filter unit 13 and the second filter unit 23 comprise respectively a canister 41 and 43 containing as filter 17, 27 a SiOx filter cartridge. Each canister 41 and 43 is connected to a respective pressurizing valve 45 and 47 allowing to increase pressure in the canister 41 or 43 up to atmospheric pressure in order to allow a filter exchange.

The needle valve 39 is configured to be controlled between a closed position inhibiting a gas flow between the first 13 and the second 23 filtration branch and at least one open position allowing gas to flow between said first 13 and second 23 filtration branch.

It is important that after an exchange of a filter 17 or 27, when the canister 13 or 23 is still under atmospheric pressure that the canister 13 or 23 is pulled down to the process pressure of the Czochralski process without disturbing crystal growth.

Thus when under process pressure conditions, the vacuum pump 9 exhibits a maximum pumping flow, then the needle valve is configured to let pass in said open position at most a gas flow enough to begin pressure reduction in the first 15 respective second 25 SiOx filter unit in a way that pressure variation at Czochralski puller 3 is in the acceptable tolerance limits of Czochralski pulling process. The dimension of the needle valve is adapted to the pumping capacity of vacuum pump 9.

In the following, an example of a method of operation of the SiOx dust filter system 3 is described.

In this example, it is assumed that filter 17 is clogged and needs to be exchanged.

In this case, in a first step 100, the upstream 29 and downstream 31 valves of the second filtration branch 23 are in an open position to assure SiOx dust filtration during crystal growth in the Czochralski process. The needle valve 39 and the upstream 19 and downstream 21 valves of the first filtration branch 13 are closed in order to isolate the SiOx filter unit 15.

Then, in a step 102, the canister valve 45 is opened in order to put the canister 41 at atmospheric pressure.

Now that the canister 41 is at atmospheric pressure, the canister 41 is opened and the filter 17 of the isolated SiOx filter unit 13 can be exchanged in a step 104.

Once the filter 17 is exchanged, said canister valve 45 and said canister 41 are closed in a step 106.

Then in a step 108, the needle valve 39 for pressure equilibration between both filtration branches 13 and 23 is opened. As the flow through the needle valve is quite small with respect to the maximum pumping flow of pump 9, the overall pressure in particular in the puller 3 is only very slightly affected and in a way that the pressure stays in the limit of the authorized pressure control limits for the crystal growth.

Once pressure equilibration is achieved between both filtration branches 13 and 23, in step 110, the needle valve 39 is closed and the downstream valve 21 opened ensuring both canister systems maintain equal pressure.

Now filtration unit 15 is ready to filtration operation. Before putting the filtration unit 15 in the filtration circuit, one may wait that filter 27 is going to be clogged.

Upstream valve 19 might be opened to provide full filtration force by the first filtration branch 13.

One therefore understands that the SiOx dust filter system according to the inventions allows a continuous operation of a Czochralski puller installation and does not need expensive investments for change of existing installations.

The invention claimed is:

1. A Czochralski puller installation for Si monocrystalline ingot growth, comprising:
    a Czochralski puller;
    a SiOx dust filter system; and
    a vacuum pump connected downstream of said SiOx dust filter system, the SiOx dust filter system comprising
        at least a first filtration branch having a first SiOx filter unit presenting an exchangeable filter contained in a canister comprising a canister valve configured to allow an increase in pressure in the canister to atmospheric pressure during a filter change, a first upstream valve and a first downstream valve configured to isolate the first SiOx filter unit during the filter change, and
        at least a second filtration branch having a second SiOx filter unit presenting an exchangeable filter contained in a canister comprising a canister valve configured to allow an increase in pressure in the canister to atmospheric pressure during a filter change, a second upstream valve and a second downstream valve configured to isolate the second SiOx filter unit during the filter change,
    the first filtration branch and the second filtration branch being disposed in parallel and connected to a common first connection point upstream of the first and the second upstream valves and to a common second connection point downstream of the first and the second downstream valves, wherein the first and the second filtration branches are connected through a bypass branch having a needle valve for pressure equilibration between the first and the second filtration branches,
    wherein the common second connection point is configured to be connected to the vacuum pump, the vacuum pump having a maximum pumping flow, and the needle valve is configured to let pass, in one open position, a gas flow enough for pressure reduction in one of the first and respective second SiOx filter units while pressure variation at the Czochralski puller stays in tolerance limits of a Czochralski pulling process.

2. The Czochralski puller installation according to claim 1, wherein the first filter unit and the second filter unit comprise respectively, as a filter, a SiOx filter cartridge.

3. The Czochralski puller installation according to claim 1, wherein the needle valve is configured to be controlled between a closed position inhibiting a gas flow between the first and the second filtration branches and at least the one open position allowing gas to flow between the first and the second filtration branches.

4. The Czochralski puller installation according to claim 1, wherein the bypass branch is connected to a third connection point disposed between the first SiOx filter unit and the first upstream valve of the first filtration branch and a fourth connection point disposed between the second SiOx filter unit and the second upstream valve of the second filtration branch.

5. A method for operating a Czochralski puller installation according to claim 1, the method comprising:
    closing the needle valve, an upstream valve, and a downstream valve of one filtration branch to isolate the SiOx filter unit, the upstream and the downstream valves of the other filtration branch being in an open position;
    opening a canister valve to put the canister of said SiOx filter unit at atmospheric pressure;
    opening the canister and exchanging the filter of the isolated SiOx filter unit;
    closing said canister valve and said canister;
    opening said needle valve for pressure equilibration between both filtration branches;
    opening said downstream valve for maintaining equal pressure between both filtration branches; and
    closing said needle valve.

* * * * *